(12) United States Patent
Huang et al.

(10) Patent No.: US 12,183,824 B2
(45) Date of Patent: Dec. 31, 2024

(54) THIN FILM TRANSISTOR AND METHOD FOR MANUFACTURING THE SAME, ARRAY SUBSTRATE AND DISPLAY DEVICE

(71) Applicant: BOE TECHNOLOGY GROUP CO., LTD., Beijing (CN)

(72) Inventors: Jie Huang, Beijing (CN); Jiayu He, Beijing (CN); Ce Ning, Beijing (CN); Zhengliang Li, Beijing (CN); Hehe Hu, Beijing (CN); Fengjuan Liu, Beijing (CN); Nianqi Yao, Beijing (CN); Kun Zhao, Beijing (CN); Tianmin Zhou, Beijing (CN); Jiushi Wang, Beijing (CN); Zhongpeng Tian, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 473 days.

(21) Appl. No.: 17/611,156

(22) PCT Filed: Jan. 28, 2021

(86) PCT No.: PCT/CN2021/074058
§ 371 (c)(1),
(2) Date: Nov. 14, 2021

(87) PCT Pub. No.: WO2022/160149
PCT Pub. Date: Apr. 8, 2022

(65) Prior Publication Data
US 2023/0091604 A1 Mar. 23, 2023

(51) Int. Cl.
*H01L 29/786* (2006.01)
*H01L 27/12* (2006.01)
(Continued)

(52) U.S. Cl.
CPC .... *H01L 29/78606* (2013.01); *H01L 27/1225* (2013.01); *H01L 27/127* (2013.01);
(Continued)

(58) Field of Classification Search
CPC ........... H01L 21/02365; H01L 21/0255; H01L 21/82387; H01L 21/02181;
(Continued)

(56) References Cited

U.S. PATENT DOCUMENTS 8,142,862 B2 * 3/2012 Lee ...................... H01L 21/3185
427/585
8,913,212 B2 * 12/2014 Wakimoto ............... G09G 3/36
362/97.3
(Continued)

FOREIGN PATENT DOCUMENTS

CN 104882486 A 9/2015
CN 106960880 A 7/2017
(Continued)

OTHER PUBLICATIONS

Extended European search report of counterpart European application No. 21921769.2 issued on Jul. 7, 2023.

*Primary Examiner* — Nikolay K Yushin
(74) *Attorney, Agent, or Firm* — Lippes Mathias LLP (57) ABSTRACT

The present disclosure relates to the field of display technologies, and in particular to a thin film transistor and a method for manufacturing the same, an array substrate and a display device. An active layer of the thin film transistor includes at least two metal oxide semi-conductor layers, the at least two metal oxide semi-conductor layers include a channel layer and a first protection layer, and metals in the channel layer include tin, and at least one of indium, gallium and zinc. The first protection layer includes praseodymium used to absorb photo-generated electrons from at least one of
(Continued)

the channel layer and the first protection layer which is under light irradiation and reduce a photo-generated current caused by the light irradiation.

20 Claims, 8 Drawing Sheets

(51) Int. Cl.
  *H01L 29/66*    (2006.01)
  *G02F 1/1368*    (2006.01)

(52) U.S. Cl.
  CPC .... *H01L 29/66969* (2013.01); *H01L 29/7869* (2013.01); *G02F 1/1368* (2013.01)

(58) Field of Classification Search
  CPC ......... H01L 21/76826; H01L 21/76832; H01L 27/1225; H01L 27/12; H01L 27/127; H01L 29/78606; H01L 29/78642; H01L 29/78645; H01L 29/786; H01L 29/66969; H01L 29/66; H01L 29/7869; G02F 1/1368; G02F 1/13338; G02F 1/133621
  See application file for complete search history.

(56) References Cited

U.S. PATENT DOCUMENTS

| | | | |
|---|---|---|---|
| 9,911,762 B2* | 3/2018 | Yan | H01L 29/78648 |
| 10,043,918 B2 | 8/2018 | Yamazaki et al. | |
| 10,128,384 B2 | 11/2018 | Yamazaki et al. | |
| 2012/0092587 A1* | 4/2012 | Wakimoto | G02F 1/133603 349/61 |
| 2014/0061631 A1* | 3/2014 | Lee | H01L 29/7869 257/43 |
| 2014/0339560 A1 | 11/2014 | Yamazaki et al. | |
| 2017/0162606 A1* | 6/2017 | Yan | H01L 27/1248 |
| 2020/0027993 A1 | 1/2020 | Xu et al. | |
| 2021/0083125 A1 | 3/2021 | Xu et al. | |
| 2022/0059661 A1 | 2/2022 | Xu et al. | |

FOREIGN PATENT DOCUMENTS

| | | |
|---|---|---|
| CN | 109638070 A | 4/2019 |
| CN | 110767745 A | 2/2020 |
| CN | 211957649 U | 11/2020 |
| JP | 2015144175 A | 8/2015 |
| TW | 201830675 A | 8/2018 |

* cited by examiner

THIN FILM TRANSISTOR AND METHOD FOR MANUFACTURING THE SAME, ARRAY SUBSTRATE AND DISPLAY DEVICE

CROSS REFERENCE TO RELATED APPLICATION

This application is a 371 of PCT Patent Application Serial No. PCT/CN2021/074058, filed on Jan. 28, 2021, the entire contents of which are incorporated herein by reference.

TECHNICAL FIELD

The present disclosure relates to the field of display technologies, and in particular to a thin film transistor and a method for manufacturing the same, an array substrate and a display device.

BACKGROUND

A thin film transistor (TFT) is a core element of a display device that switches and drives each pixel in the display device. Based on different semi-conductor materials of an active layer of the TFT, the TFT mainly includes an oxide thin film transistor and an amorphous silicon thin film transistor. The oxide thin film transistor has high mobility, may improve resolution of the display device, and thus is more and more widely used in the display device.

An active layer of the oxide thin film transistor is connected to a source electrode and a drain electrode of the oxide thin film transistor respectively. When the oxide thin film transistor is operated, current carriers are generated in the active layer, and the source electrode and the drain electrode that are connected to the active layer are conducted, such that the oxide thin film transistor is conducted and starts operation.

In the related art, the active layer of the oxide thin film transistor is an oxide semi-conductor very sensitive to light and easily affected by light. When the light irradiates the active layer, photo-generated current carders are generated to conduct the oxide thin film transistor which is not operated originally, thereby affecting the stability of the oxide thin film transistor.

SUMMARY

Embodiments of the present disclosure provide a thin film transistor and a method for manufacturing the same, an array substrate and a display device to improve the stability of the oxide thin film transistor.

According to an aspect of embodiments of the present disclosure, a thin film transistor is provided. The thin film transistor includes an active layer, the active layer includes at least two laminated metal oxide semi-conductor layers, the at least two metal oxide semi-conductor layers include a channel layer and a first protection layer, and metal elements in the channel layer include tin, and at least one of indium, gallium and zinc; the first protection layer includes praseodymium used to absorb photo-generated electrons in the metal oxide semi-conductor and reduce a photo-generated current caused by light irradiation.

In some embodiments of the present disclosure, the metal elements in the channel layer include tin, indium and gallium; a ratio of the number of indium atoms in the channel layer to the total number of indium atoms, gallium atoms and tin atoms in the channel layer is between 65% and 75%; a ratio of the number of gallium atoms in the channel layer to the total number of indium atoms, gallium atoms and tin atoms in the channel layer is between 24% and 30%; a ratio of the number of tin atoms in the channel layer to the total number of indium atoms, gallium atoms and tin atoms in the channel layer is between 1% and In some embodiments of the present disclosure, contents of praseodymium atoms in the first protection layer are not completely same at different thickness positions of the first protection layer, and the number of praseodymium atoms per unit volume at a side of the first protection layer distal from the channel layer is less than the number of praseodymium atoms per unit volume at a side of the first protection layer proximal to the channel layer.

In some embodiments of the present disclosure; praseodymium is doped into the channel layer; in the channel layer, the number of praseodymium atoms per unit volume in the channel layer monotonically decreases in a direction from being proximal to the first protection layer to being distal from the first protection layer.

In some embodiments of the present disclosure, the metal elements in the first protection layer further include at least one of tin, indium, gallium and zinc, and a ratio of the number of praseodymium atoms in the first protection layer to the total number of atoms of metal elements in the first protection layer is between 1% and 50%.

In some embodiments of the present disclosure; the metal elements in the first protection layer further include indium, gallium and zinc; a ratio of the number of indium atoms in the first protection layer to the total number of indium atoms, gallium atoms and zinc atoms in the first protection layer is between 45% and 55%; a ratio of the number of gallium atoms in the first protection layer to the total number of indium atoms, gallium atoms and zinc atoms in the first protection layer is between 25% and 35%; a ratio of the number of zinc atoms in the first protection layer to the total number of indium atoms, gallium atoms and zinc atoms in the first protection layer is between 15% and 25%.

In some embodiments of the present disclosure, the first protection layer is disposed on a surface of the channel layer distal from a base substrate.

In some embodiments of the present disclosure, the at least two metal oxide semi-conductor layers further include a second protection layer disposed on a surface of the channel layer proximal to the base substrate; the second protection layer includes praseodymium.

In some embodiments of the present disclosure, the second protection layer is an indium gallium zinc oxide layer including praseodymium, and a ratio of the number of praseodymium atoms in the second protection layer to the total number of atoms of metal elements in the second protection layer is between 1% and 50%.

In some embodiments of the present disclosure, the at least two metal oxide semi-conductor layers further include a source drain layer disposed on a surface of the first protection layer distal from the base substrate; and a covering layer disposed between the first protection layer and the source drain layer, wherein the covering layer is a crystalline oxide layer without doped praseodymium.

In some embodiments of the present disclosure, the covering layer is a crystalline metal oxide layer, and metals in the crystalline metal oxide layer include at least one of indium, gallium, zinc and tin.

In some embodiments of the present disclosure, the thin film transistor further includes a diffusion layer disposed at a side of the first protection layer distal from the base substrate; the diffusion layer is a praseodymium metal layer or a praseodymium oxide layer.

In some embodiments of the present disclosure, the first protection layer is disposed on a surface of the channel layer proximal to the base substrate.

In some embodiments of the present disclosure, the thin film transistor further includes a source electrode and a drain electrode disposed on the active layer, wherein each of the source electrode and the drain electrode wraps a side wall of the active layer, respectively, and is connected to a side wall of the channel layer, respectively; each of the source electrode and the drain electrode comprises praseodymium.

According to another aspect of embodiments of the present disclosure, a method for manufacturing a thin film transistor is provided. The method includes:

providing a base substrate; and forming an active layer of a thin film transistor by sequentially forming at least two metal oxide semi-conductor layers on the base substrate, wherein the at least two metal oxide semi-conductor layers include a channel layer and a first protection layer, and metal elements in the channel layer include tin and at least one of indium, gallium and zinc; the first protection layer includes praseodymium used to absorb photo-generated electrons in the metal oxide semi-conductor and reduce a photo-generated current caused by light irradiation.

In some embodiments of the present disclosure, sequentially forming at least two metal oxide semi-conductor layers on the base substrate includes: forming an indium gallium tin oxide film layer on the base substrate; forming a diffusion film layer at a side of the indium gallium tin oxide film layer distal from the base substrate, wherein the diffusion film layer is a praseodymium metal film layer or a praseodymium oxide film layer; obtaining an active layer including the channel layer and the first protection layer that are sequentially laminated on the base substrate by performing annealing for the indium gallium tin oxide film layer and the diffusion film layer and diffusing praseodymium in the diffusion film layer into the indium gallium tin oxide film layer and obtaining a diffusion layer on the active layer by patterning the diffusion film layer, wherein the diffusion layer is disposed at a side of the first protection layer distal from the base substrate, and the diffusion layer is a praseodymium metal layer or a praseodymium oxide layer.

In some embodiments of the present disclosure, the method further includes: forming a source drain metal layer on the diffusion layer, wherein the source drain metal layer includes praseodymium; and forming a source electrode and a drain electrode by patterning the source drain metal layer.

According to still another aspect of embodiments of the present disclosure, an array substrate is provided. The array substrate includes a base substrate and a plurality of thin film transistors on the base substrate the thin film transistor is the thin film transistor according to any of the above aspects.

In some embodiments of the present disclosure, the array substrate further includes a first insulation layer covered on the first protection layer, the source electrode and the drain electrode; a first electrode layer including a plurality of first electrodes disposed at a side of the first insulation layer distal from the base substrate; a second insulation layer covered on the plurality of first electrodes; and a second electrode layer disposed at a side of the second insulation layer distal from the base substrate and electrically connected to the source electrode or the drain electrode in the corresponding thin film transistor.

According to yet another aspect of embodiments of the present disclosure, a display device is provided. The display device includes the array substrate according to any of the above aspects.

The technical solutions according to the embodiments of the present disclosure have at least the following beneficial effects.

In the embodiments of the present disclosure, when the thin film transistor is operated, the channel layer is a main channel area. The first protection layer protects the channel layer. When the light irradiates the channel layer from a side of the first protection layer, the light firstly irradiates the first protection layer, and the first protection layer shields the light to reduce an impact of the light on the channel layer, thereby improving the stability of the thin film transistor. When the first protection layer is irradiated by the light, photo-generated current carriers are also generated. Since the first protection layer includes praseodymium, praseodymium introduces an intermediate energy level state, which is also referred to as a trap state, into an internal bandgap of the first protection layer. When the first protection layer irradiated by the light generates the photo-generated current carriers, the photo-generated current carriers are trapped by the trap state in the first protection layer and digested in the first protection layer, and thus do not affect functions of the actual channel area. Further, the tin element included in the channel layer may improve the mobility of the thin film transistor, thereby increasing a response speed of the thin film transistor.

BRIEF DESCRIPTION OF THE DRAWINGS

For clearer descriptions of the technical solutions in the embodiments of the present disclosure, the following briefly introduces the accompanying drawings required for describing the embodiments. Apparently, the accompanying drawings in the following description show merely some embodiments of the present disclosure, and persons of ordinary skill in the art may still derive other drawings from these accompanying drawings without creative efforts.

DETAILED DESCRIPTION

For clearer descriptions of the objectives, technical solutions, and advantages of the present disclosure, embodiments of the present disclosure are described in detail hereinafter with reference to the accompanying drawings.

Figure 1:
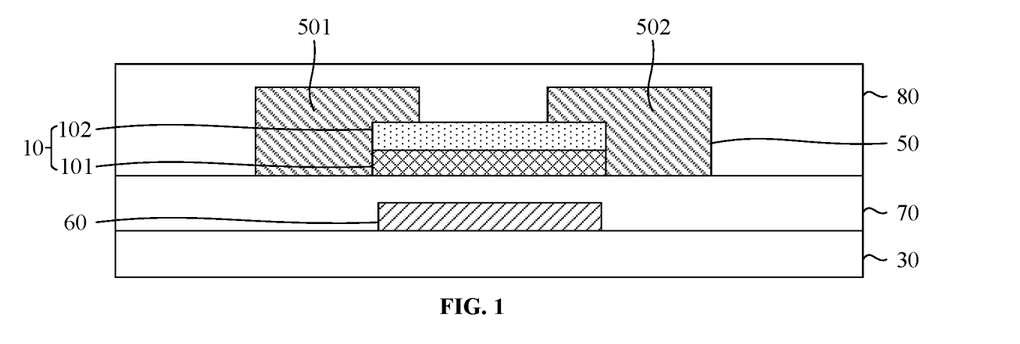
FIG. 1 is a sectional structural schematic diagram of a thin film transistor according to an embodiment of the present disclosure.

An embodiment of the present disclosure provides a thin film transistor. FIG. 1 is a sectional structural schematic diagram of a thin film transistor according to an embodiment of the present disclosure. As shown in FIG. 1, an active layer 10 of the thin film transistor includes at least two laminated metal oxide semi-conductor layers, and the at least two metal oxide semi-conductor layers at least include a channel layer 101 and a first protection layer 102. Metals in the channel layer 101 include a tin (Sn) element and al least one of an indium (In) element, a gallium (Ga) element and a zinc (Zn) element. The first protection layer 102 includes praseodymium used to absorb photo-generated electrons in the metal oxide semi-conductor and reduce a photo-generated current caused by light irradiation.

Optionally, the thin film transistor is a top gate, bottom gate or dual gate structure. The top gate structure refers to that a gate electrode is disposed at a side of the active layer distal from a base substrate, the bottom gate structure refers to that the gate electrode is disposed at a side of the active layer proximal to the base substrate, and the dual gate structure refers to that the thin film transistor includes two gate electrodes disposed at different layers and isolated by a gate insulator layer. Two gate electrodes are both disposed at a side of the active layer distal from the base substrate, or both disposed at a side of the active layer proximal to the base substrate.

In embodiments of the present disclosure, when the thin film transistor is operated, the channel layer 101 is an actual channel area. The first protection layer 102 protects the channel layer 101. When light irradiates the channel layer 101 from a side of the first protection layer 102, the light firstly irradiates the first protection layer 102, and the first protection layer 102 shields the light to reduce an impact of the light on the channel layer 101, thereby improving the stability of the thin film transistor. When the first protection layer 102 is irradiated by the light, photo-generated current carriers are also generated. Since the first protection layer 102 includes praseodymium, praseodymium introduces an intermediate energy level state, which is also referred to as a trap state, into an internal bandgap of the first protection layer 102. When the first protection layer 102 irradiated by the light generates the photo-generated current carriers, the photo-generated current carriers are trapped by the trap state in the first protection layer 102 and digested in the first protection layer 102, and thus do not affect functions of the actual channel area. Further, the in element included in the channel layer 101 may improve the mobility of the thin film transistor, thereby increasing a response speed of the thin film transistor.

Since the active layer of the thin film transistor according to an embodiment of the present disclosure is made of an oxide, the thin film transistor is referred to as an oxide thin film transistor.

In some embodiments of the present disclosure, metal elements in the channel layer 101 include tin, indium and gallium. A ratio of the number of indium atoms in the channel layer 101 to the total number of indium atoms, gallium atoms and tin atoms in the channel layer 101 is between 65% and 75%. A ratio of the number of gallium atoms in the channel layer 101 to the total number of indium atoms, gallium atoms and tin atoms in the channel layer 101 is between 24% and 30%. A ratio of the number of tin atoms in the channel layer 101 to the total number of indium atoms, gallium atoms and tin atoms in the channel layer 101 is between 1% and 5%.

In some embodiments of the present disclosure, a ratio of the numbers of indium atoms, gallium atoms and tin atoms in the channel layer 101 is between 90:20:1 and 20:10:1. The ratio is determined based on the above ratios of indium atoms, gallium atoms and tin atoms.

The channel layer 101 has different mobility due to different ratios of various elements in the channel layer 101. By configuring various elements in the channel layer 101 based on the above ratio, the mobility of the thin film transistor may reach 30 cm$^2$/(V·S) to 50 cm$^2$/(V·S), thereby further improving the mobility of the thin film transistor. Further, the channel layer 101 configured based on the above ratio of the numbers of atoms is in a crystalline state.

In some examples, the ratio of the numbers of indium atoms, gallium atoms and tin atoms in the channel layer 101 is 57:21:2. In other examples, the ratio of the numbers of indium atoms, gallium atoms and tin atoms in the channel layer 101 is 29:11:1.

It is to be noted that the ratio of the numbers of various atoms in the channel layer 101 may fluctuate due to errors in a preparation process, and the number ratio of each atom in the channel layer 101 fluctuates within a range of ±10%.

For example, the ratio of the numbers of indium atoms, gallium atoms and tin atoms in the channel layer 101 is 29:11:1, and the ratio of the number of indium atoms in the channel layer 101 fluctuates within a range of ±5%. Thus, the ratio of the numbers of indium atoms, gallium atoms and tin atoms in the channel layer 101 is between 27.55:11:1 and 30.45:11:1 at this time. For example, the ratio of the numbers of indium atoms, gallium atoms and tin atoms is 30:11:1.

In embodiments of the present disclosure, a thickness of the channel layer 101 is no more than 30 nm, for example, 25 nm.

In embodiments of the present disclosure, a thickness of the first protection layer 102 is no more than 20 nm, for example, 20 nm.

In some embodiments of the present disclosure, metal elements of the first protection layer 102 further include at least one of tin, indium, gallium and zinc.

In an exemplary embodiment, the first protection layer 102 is an indium gallium zinc oxide (IGZO) layer doped with praseodymium.

An indium gallium zinc oxide is easily acquired, and the indium gallium zinc oxide doped with praseodymium may enable the first protection layer 102 to protect the channel layer 101 under light irradiation.

In some embodiments of the present disclosure, a ratio of the number of indium atoms in the first protection layer 102 to the total number of indium atoms, gallium atoms and zinc atoms in the first protection layer 102 is between 45% and 55%; a ratio of the number of gallium atoms in the first protection layer 102 to the total number of indium atoms, gallium atoms and zinc atoms in the first protection layer 102 is between 25% and 35%; a ratio of the number of zinc atoms in the first protection layer 102 to the total number of indium atoms, gallium atoms and zinc atoms in the first protection layer 102 is between 15% and 25%.

In embodiments of the present disclosure, a ratio of the numbers of indium atoms, gallium atoms and zinc atoms in the first protection layer 102 is between 6:3:1 and 3:3:1. The ratio is determined based on the above ratios of indium atoms, gallium atoms and zinc atoms.

In some examples, the ratio of the numbers of indium atoms, gallium atoms and zinc atoms in the first protection layer 102 is 46:29:21. In other examples, the ratio of the numbers of indium atoms, gallium atoms and zinc atoms in the first protection layer 102 is 23:14:10.

In some embodiments of the present disclosure, a ratio of the number of praseodymium atoms in the first protection layer 102 to the total number of atoms of metal elements in the first protection layer 102 is between 1% and 50%.

Praseodymium is easily acquired and cheap, thereby lowering the manufacturing cost. After praseodymium is doped into the indium gallium zinc oxide, an intermediate energy level state is introduced into the indium gallium zinc oxide to accelerate recombination of photo-generated current carriers, wherein the intermediate energy level state is referred to as a trivalent praseodymium ($Pr^{3+}$) trap state. The trap stale may provide an electronic recombination step. When the indium gallium zinc oxide irradiated by light generates the photo-generated current carriers (i.e., photo-generated charges), the photo-generated current carriers are rapidly trapped the trivalent praseodymium trap state, and recombined with the electronic recombination step. Therefore, the lifetime of the photo-generated current carriers is shortened, the concentration of the photo-generated current carriers is reduced, and the photo-generated current carriers are digested internally without further affecting the channel layer, thereby improving the light irradiation stability and the mobility of the thin film transistor.

At the same time, a ratio of the content of the doped praseodymium element is controlled to ensure the first protection layer 102 to achieve an optimal protection effect of protecting the channel layer 101, thereby further improving the light stability of the thin film transistor.

In an exemplary embodiment, the number of praseodymium atoms in the first protection layer 102 accounts for 5% of the total number of indium atoms, gallium atoms and zinc atoms in the first protection layer 102.

In some examples, a ratio of the numbers of indium atoms, gallium atoms, zinc atoms and praseodymium atoms in the first protection layer 102 is 46:29:21:4. In other examples, the ratio of the numbers of indium atoms, gallium atoms, zinc atoms and praseodymium atoms in the first protection layer 102 is 23:14:10:2.

Similarly, the ratio of the numbers of various atoms in the first protection layer 102 may also fluctuate, and the number ratio of each atom also fluctuates within a range of ±10.

In embodiments of the present disclosure, the ratio of the content of praseodymium refers to the ratio of the number of praseodymium atoms to the number of atoms of all metal elements in the first protection layer 102.

In embodiments of the present disclosure, contents of praseodymium atoms in the first protection layer 102 are not completely same at different thickness positions of the first protection layer 102, and the number of praseodymium atoms per unit volume at a side of the first protection layer 102 distal from the channel layer 101 is less than the number of praseodymium atoms per unit volume at a side of the first protection layer 102 proximal to the channel layer 101.

Optionally, in other implementations, the first protection layer 102 is a praseodymium oxide (Pr-oxide) layer, for example, a $Pr_2O_3$ layer.

In embodiments of the present disclosure, the channel layer 101 includes praseodymium, and a percentage of the number of atoms of praseodymium in the channel layer 101 to the number of atoms of all metal elements in the channel layer 101 is less than a percentage of the number of atoms of praseodymium in the first protection layer 102 to the number of atoms of all metal elements in the first protection layer 102.

Annealing is required in a process of manufacturing an active layer 10. During annealing, praseodymium in the first protection layer 102 may be doped into the channel layer 101, such that the channel layer 101 also includes praseodymium. However, since praseodymium is doped into the channel layer 101 from the first protection layer 102, the ratio of the content of praseodymium in the channel layer 101 is less than the ratio of the content of praseodymium in the first protection layer 102.

At the same time, in the channel layer 101, the ratio of the content of praseodymium in the channel layer 101 gradually decreases in a direction from being proximal to the first protection layer 102 to being distal from the first protection layer 102.

In an exemplary embodiment, the number of praseodymium atoms in the channel layer 101 accounts for 2% of the total number of indium atoms, gallium atoms and tin atoms in the channel layer 101.

A reference is further made to FIG. 1. The active layer 10 is disposed on a base substrate 30. The first protection layer 102 is disposed on a surface of the channel layer 101 distal from the base substrate 30.

When the thin film transistor is operated, much light irradiates the channel layer 101 from a side distal from a surface of the base substrate 30. The first protection layer 102 is disposed on a surface of the channel layer 101 distal from the base substrate 30 to shield ambient light irradiating the channel layer 101 from a side distal from the surface of the base substrate 30, thereby reducing the impact of the light on the channel layer 101. At the same time, when praseodymium in the first protection layer 102 is diffused into the channel layer 101, there are less praseodymium elements at a side of the channel layer 101 proximal to the base substrate 30, thereby avoiding reducing the stability of the thin film transistor.

A reference is further made to FIG. 1. The thin film transistor further includes a source drain (SD) layer 50. The source drain layer 50 includes a source electrode 501 and a drain electrode 502 disposed on the active layer 10; each of the source electrode 501 and the drain electrode 502 wraps a side wall of the active layer 10, respectively, and is connected to a side wall of the channel layer 101, respectively.

For a thin film transistor, the source electrode 501 and the drain electrode 502 in the source drain layer 50 are to be connected to the channel layer 101 respectively. When the thin film transistor is operated, the source electrode 501 and the drain electrode 502 are conducted by the channel layer 101. However, in FIG. 1, it is impossible to connect the source electrode 501 and the drain electrode 502 to the channel layer 101 from the above of the channel layer 101 since the channel layer 101 is disposed below the first protection layer 102, each of the source electrode 501 and the drain electrode 502 wraps the side wall of the active layer 10, respectively, that is, each of the source electrode 501 and the drain electrode 502 is connected to the channel layer 101 through a side wall of the channel layer 101.

In embodiments of the present disclosure, the source drain layer 50 is a metal layer or an indium tin oxide (ITO) layer to ensure conductivity of the source drain layer 50.

A reference is further made to FIG. 1. The thin film transistor further includes a gate electrode 60 and a gate insulator (GI) layer 70. The gate electrode 60 is disposed at a side of the active layer 10 proximal to the base substrate 30. The gate insulator layer 70 is disposed between the active layer 10 and the gate electrode 60 to isolate the active layer 10 from the gate electrode 60.

In an exemplary embodiment, the gate electrode 60 is made of a metal, for example, copper; or the gate electrode 60 is made of a transparent conductive material, for example, indium tin oxide.

In embodiments of the present disclosure, the gate electrode 60 and the first protection layer 102 are disposed at both sides of the channel layer 101 respectively to shield the light for the channel layer 101 from both sides.

In an exemplary embodiment, the gate insulator layer 70 may be a silicon oxide layer, a silicon nitride layer or an epoxy resin layer.

As shown in FIG. 1, the thin film transistor further includes a first insulation (PVX) layer 80. The first insulation layer 80 is covered on the first protection layer 102 and the source drain layer 50.

The first insulation layer 80 is disposed to isolate the source drain layer 50 from a film layer disposed above the source drain layer 50, thereby avoiding affecting transmission of an electrical signal of the source drain layer 50.

In an exemplary embodiment, the first insulation layer 80 is a silicon oxide layer.

In embodiments of the present disclosure, the first insulation layer 80 generally is the silicon oxide layer and includes a silicon element, and the channel layer 101 is an indium gallium tin oxide layer and does not include the silicon element; thus, if the channel layer 101 is in direct contact with the first insulation layer 80, an interface state is generated at a contact surface of the channel layer 101 and the first insulation layer 80, thereby affecting the mobility of the thin film transistor. The first protection layer 102 not including the silicon element isolates the first insulation layer 80 from the channel layer 101, thereby avoiding affecting the mobility of the thin film transistor due to the interface state.

The thin film transistor shown in FIG. 1 is a thin film transistor of a bottom gate structure. In other implementations, the thin film transistor may also be a thin film transistor of a top gate structure, with a specific structure shown in FIG. 2.

Figure 2:
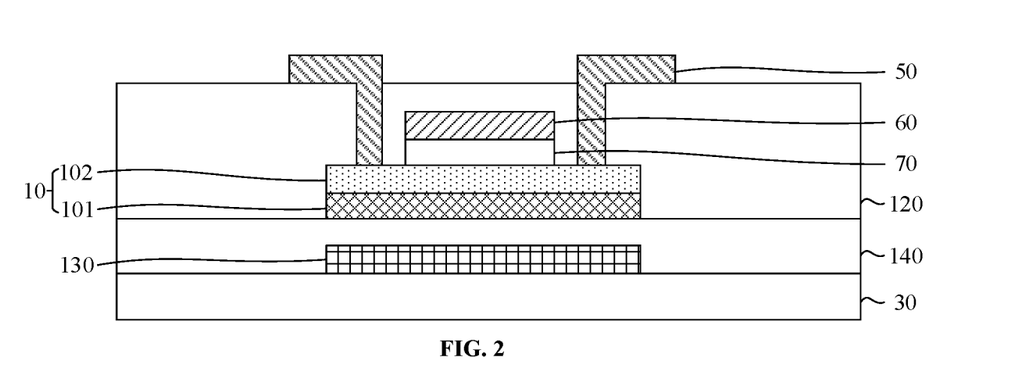
FIG. 2 is a sectional structural schematic diagram of a thin film transistor according to an embodiment of the present disclosure.

FIG. 2 is a sectional structural schematic diagram of a thin film transistor according to an embodiment of the present disclosure. As shown in FIG. 2, the gate insulator layer 70 is disposed at a side of the first protection layer 102 distal from the base substrate 30, and the gate electrode 60 is disposed at a side of the gate insulator layer 70 distal from the base substrate 30. That is, the gate electrode 60 is disposed above the active layer 10, and is the thin film transistor of the top gate structure.

A reference is further made to FIG. 2. For the thin film transistor of the top gate structure, the protection layer 102 isolates the gate insulator layer 70 from the channel layer 101 to avoid the direct contact between the channel layer 101 and the gate insulator layer 70 and prevent the generation of the interface state between the gate insulator layer 70 and the channel layer 101 from affecting the mobility of the thin film transistor.

A reference is further made to FIG. 2, The thin film transistor further includes an interlayer dielectric (ILD) layer 120. The interlayer dielectric layer 120 wraps the gate electrode 60 and the active layer 10, and the source drain layer 50 is disposed on the interlayer dielectric layer 120. That is, the interlayer dielectric layer 120 isolates the gate electrode 60 from the source drain layer 50.

In an exemplary embodiment, the interlayer dielectric layer 120 is a silicon oxide layer, a silicon nitride layer or an epoxy resin layer.

A reference is further made to FIG. 2. The thin film transistor further includes a shield layer 130 and a buffer layer 140 both disposed on the base substrate. The shield layer 130 is opposed to the channel layer 101, and the buffer layer 140 is disposed between the shield layer 130 and the channel layer 101.

In embodiments of the present disclosure, the shield layer 130 is disposed to shield the light irradiating the channel layer 101 from a side of the shield layer 130, so as to reduce the impact of the light on the channel layer 101.

Figure 3:
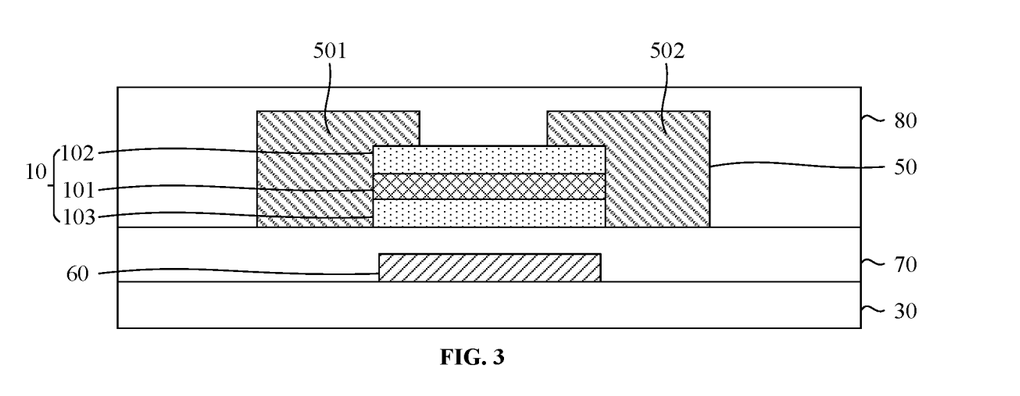
FIG. 3 is a sectional structural schematic diagram of a thin film transistor according to an embodiment of the present disclosure.

The channel layer 101 is disposed on the buffer layer 140 to reduce an impact of impurities on the base substrate 30 on the channel layer 101, FIG. 3 is a sectional structural schematic diagram of a thin film transistor according to an embodiment of the present disclosure. As shown in FIG. 3, at least two metal oxide semi-conductor layers further include a second protection layer 103. The second protection layer 103 is disposed on a surface of the channel layer 101 proximal to the base substrate 30, and the second protection layer 103 includes praseodymium.

When the thin film transistor is operated, both sides of the channel layer 101 are irradiated by light, for example, ambient light, light of a light emitting unit or light emitted from backlight. The first protection layer is disposed at two surfaces of the channel layer 101 respectively, and the second protection layer 102 is also doped with praseodymium, such that the second protection layer 103 has the same function as the first protection layer 102. When the light irradiates the channel layer 101 from two opposed surfaces of the channel layer 101, the first protection layer 102 and the second protection layer 103 may both protect the channel layer 101, thereby improving the stability of the thin film transistor.

In embodiments of the present disclosure, when the first protection layer 102 and the second protection layer 103 are disposed at two opposed surfaces of the channel layer 101 respectively, the first protection layer 102 isolates the channel layer 101 from the first insulation layer 80, and the second protection layer 103 isolates the channel layer 101 from the gate insulator layer 70 to avoid forming the interface states at two surfaces of the channel layer 101 at the same time, thereby avoiding affecting the stability of the thin film transistor.

In some embodiments of the present disclosure, the second protection layer 103 is an indium gallium zinc oxide layer including praseodymium. The number of praseodymium atoms in the second protection layer 103 accounts for 1% to 50% of the total number of indium atoms, gallium atoms and zinc atoms in the second protection layer 103.

In embodiments of the present disclosure, a ratio of indium atoms, gallium atoms and zinc atoms in the second protection layer 103 are same as the ratio of indium atoms, gallium atoms and zinc atoms in the first protection layer 102.

In an exemplary embodiment, a ratio of the numbers of indium atoms, gallium atoms and zinc atoms in the second protection layer 103 is between 6:3:1 and 3:3:1.

For example, the ratio of the numbers of indium atoms, gallium atoms and zinc atoms in the second protection layer 103 is 4:3:2. The number of praseodymium atoms in the second protection layer 103 accounts for 20% of the total number of indium atoms, gallium atoms and zinc atoms in the second protection layer 103.

Similarly, the ratio of the numbers of various atoms in the second protection layer 103 may also fluctuate, and the number ratio of each atom also fluctuates within a range of ±10%.

Optionally, the second protection layer 103 is a praseodymium oxide layer, for example, a $Pr_2O_3$ layer.

Figure 4:
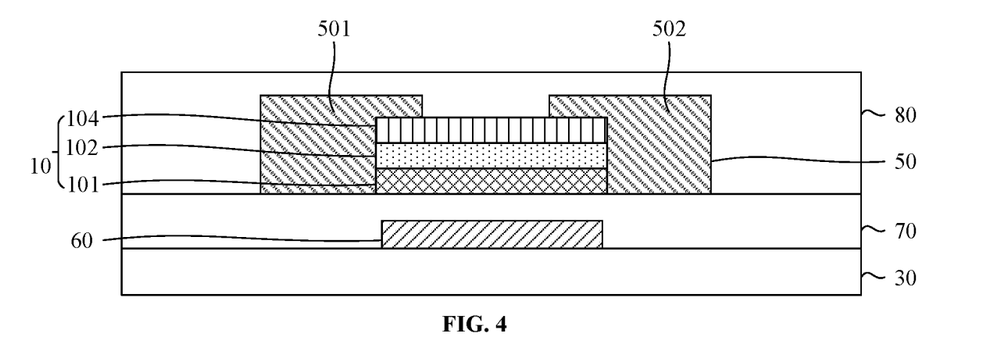
FIG. 4 is a sectional structural schematic diagram of a thin film transistor according to an embodiment of the present disclosure.

FIG. 4 is a sectional structural schematic diagram of a thin film transistor according to an embodiment of the present disclosure. As shown in FIG. 4, at least two metal oxide semi-conductor layers further include a covering layer 104. The covering layer 104 is disposed at a side of the first protection layer 102 distal from the base substrate 30, and the covering layer 104 is a crystalline oxide layer without doped praseodymium. The covering layer 104 is disposed between the source drain layer 50 and the first protection layer 102.

In embodiments of the present disclosure, the covering layer 104 is disposed on the first protection layer 102 to improve the stability of the thin film transistor under high temperature and high voltage. At the same time, when the source drain layer is etched, the crystalline oxide layer may reduce an impact of etching on the active layer 10, thereby improving the stability of the thin film transistor.

In embodiments of the present disclosure, the covering layer 104 is a crystalline metal oxide layer, and metals in the crystalline metal oxide layer include at least one of indium, gallium, zinc and tin.

In an exemplary embodiment, the covering layer 104 is any of an indium gallium zinc oxide (IGZO) layer, an indium gallium oxide (IGO) layer, an indium gallium zinc tin oxide (IGZTO) layer, an indium tin oxide (ITO) layer and an indium zinc oxide (IZO) layer.

Indium gallium zinc oxide, indium gallium oxide, indium gallium zinc tin oxide, indium tin oxide and indium zinc oxide are all common materials for manufacturing the thin film transistor, which are easy to acquire and may reduce the manufacturing cost.

Figure 5:
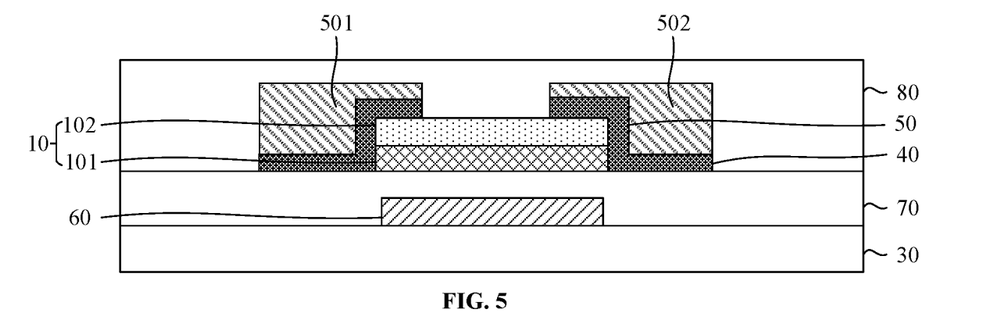
FIG. 5 is a sectional structural schematic diagram of a thin film transistor according to an embodiment of the present disclosure.

FIG. 5 is a sectional structural schematic diagram of a thin film transistor according to an embodiment of the present disclosure. As shown in FIG. 5, the thin film transistor further includes a diffusion layer 40. The diffusion layer 40 is disposed at a side of the first protection layer 102 distal from the base substrate 30, and the diffusion layer 40 is a praseodymium metal layer or a praseodymium oxide layer.

In embodiments of the present disclosure, the diffusion layer 40 is a product of manufacturing the first protection layer 102. The diffusion layer 40 is disposed on an untreated current carrier transport film layer, and then, high-temperature annealing is performed for the untreated current carrier transport film layer. During annealing, praseodymium in the diffusion layer 40 is doped into the untreated active layer, such that the first protection layer 102 including praseodymium is formed at a side of the untreated current carrier transport film layer proximal to the diffusion layer 40 and the channel layer 101 as a channel area is formed at a side of the untreated current carrier transport film layer distal from the diffusion layer 40.

A reference is further made to FIG. 5. Further, the diffusion layer 40 wraps the side wall of the active layer 10 to protect the active layer 10 when the source drain layer 50 is etched.

A reference is further made to FIG. 5. The diffusion layer 40 includes two portions separated from each other, and is disposed between the source drain layer 50 and the active layer 10. Since two portions of the diffusion layer 40 are separated from each other, a case that the diffusion layer 40 enables the connection between the source electrode 501 and the drain electrode 502 in the source drain layer 50 is avoided. In this case, the diffusion layer 40 is the praseodymium metal layer or the praseodymium oxide layer.

Optionally, in other implementations, the diffusion layer 40 may also be of an integrated structure, that is, the diffusion layer 40 is covered on the first protection layer 102, In this case, the diffusion layer 40 is the praseodymium oxide layer.

It is to be noted that in other embodiments, the diffusion layer 40 may also be removed based on FIG. 5, and praseodymium elements are included in the source electrode 501 and the drain electrode 502. Therefore, praseodymium in the source electrode 501 and the drain electrode 502 are diffused into the active layer 10. In an exemplary embodiment, the source drain layer is a metal compound doped with a praseodymium metal, or formed by superimposing a praseodymium metal film layer and another metal film layer, such as superimposing a praseodymium metal layer and a copper metal layer.

Figure 6:
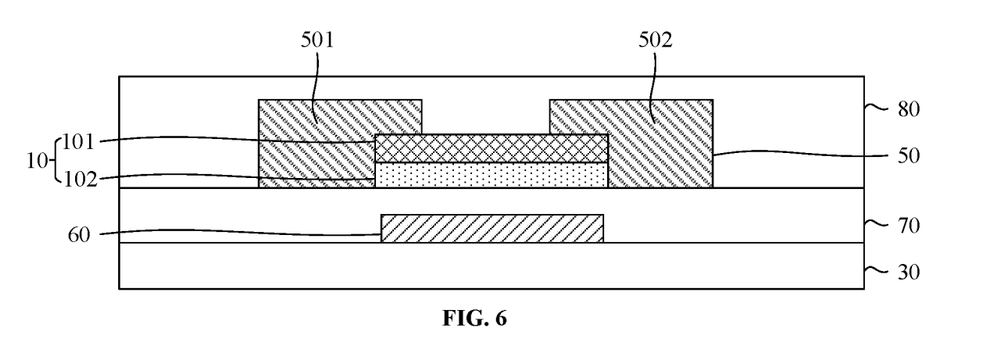
FIG. 6 is a sectional structural schematic diagram of a thin film transistor according to embodiment of the present disclosure.

It is to be noted that the diffusion layer 40 may not wrap the side wall of the active layer 10 in other embodiments. The diffusion layer 40 is laminated with the active layer 10, and disposed at a side of the active layer 10 distal from the base substrate 30. Each of the source electrode 501 and the drain electrode 502 wraps the side walls of the active layer 10 and the diffusion layer 40, respectively, FIG. 6 is a sectional structural schematic diagram of a thin film transistor according to an embodiment of the present disclosure. Different from the structure shown in FIG. 1, the first protection layer 102 in FIG. 6 is disposed on a surface of the channel layer 101 proximal to the base substrate 30.

Figure 7:
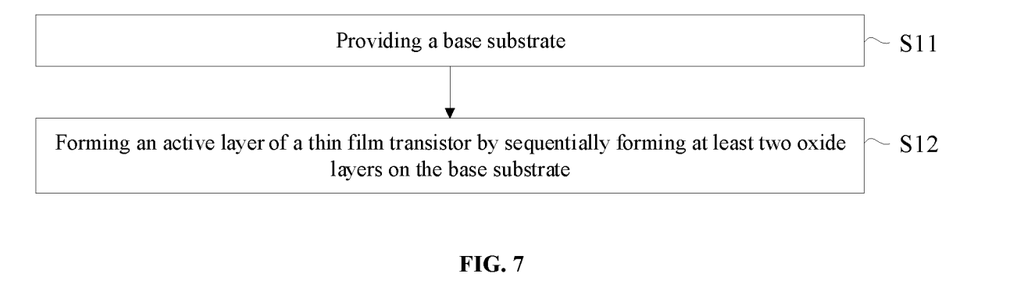
FIG. 7 is a flowchart of a method for manufacturing a thin film transistor according to an embodiment of the present disclosure.

An embodiment of the present disclosure further provides a method for manufacturing a thin film transistor, FIG. 7 is a flowchart of a method for manufacturing a thin film transistor according to an embodiment of the present disclosure. As shown in FIG. 7, the method includes the following steps.

In S11, a base substrate is provided.

In S12, an active layer of the thin film transistor is formed by sequentially forming at least two metal oxide semiconductor layers on the base substrate, wherein the at least two metal oxide semi-conductor layers include a channel layer and a first protection layer, and metal elements in the channel layer include tin, and at least one of indium, gallium and zinc; the first protection layer includes praseodymium used to absorb photo-generated electrons in the metal oxide semi-conductor and reduce a photo-generated current caused by light irradiation.

Figure 8:
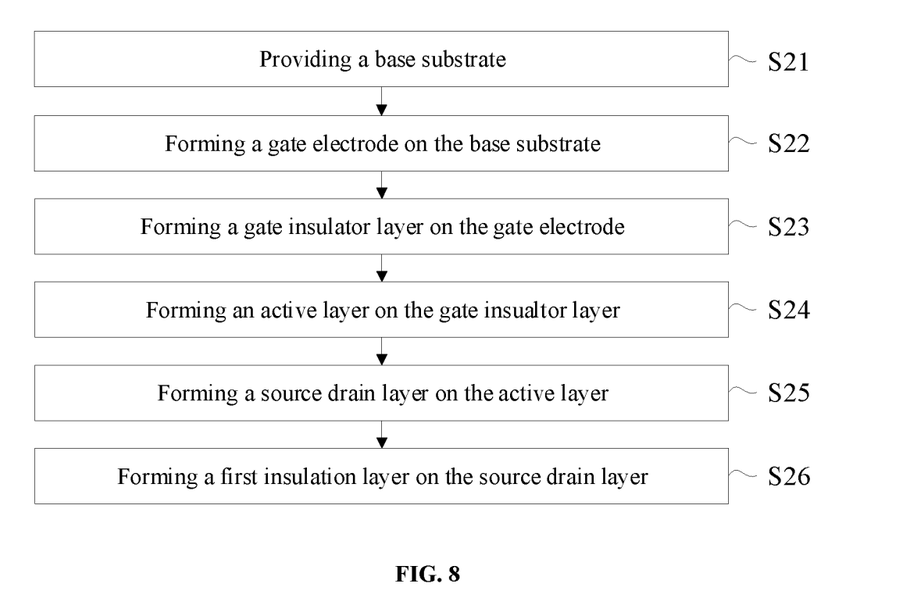
FIG. 8 is a flowchart of a method for manufacturing a thin film transistor according to an embodiment of the present disclosure.

FIG. 8 is a flowchart of a method for manufacturing a thin film transistor according to an embodiment of the present disclosure. As shown in FIG. 8, the method includes the following steps.

In S21, a base substrate is provided.

FIG. 9 to FIG. 13 are process diagrams of a method for manufacturing a thin film transistor according to an embodiment of the present disclosure. A process of manufacturing a base substrate is described hereinafter in combination with FIG. 9 to FIG. 0.13.

Figure 9:
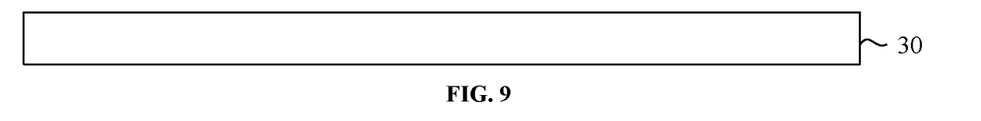
FIG. 9 is a process diagram of a method for manufacturing a thin film transistor according to an embodiment of the present disclosure.

As shown in FIG. 9, a base substrate 30 is provided.

In S22, a gate electrode is formed on the base substrate.

Figure 10:
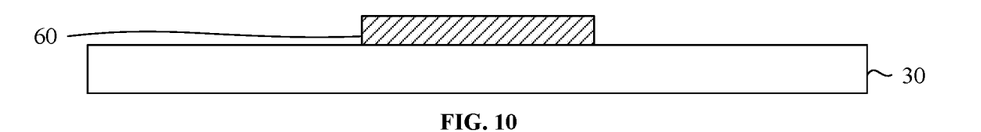
FIG. 10 is a process diagram of a method for manufacturing a thin film transistor according to an embodiment of the present disclosure.

As shown in FIG. 10, the gate electrode 60 is manufactured on the base substrate 30.

In embodiments of the present disclosure, the gate electrode 60 is a metal electrode.

In an exemplary embodiment, a gate film layer may be manufactured on the base substrate 30 by a deposition method, and then, the gate electrode 60 is acquired by patterning the gate film layer.

In S23, a gate insulator layer is formed on the gate electrode.

Figure 11:
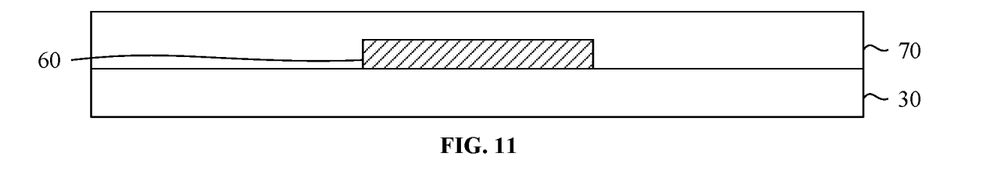
FIG. 11 is a process diagram of a method for manufacturing a thin film transistor according to an embodiment of the present disclosure.

As shown in FIG. 11, the gate insulator layer 70 is manufactured on the gate electrode 60 to wrap the gate electrode 60.

In embodiments of the present disclosure, the gate insulator layer 70 is a silicon oxide layer.

In an exemplary embodiment, the gate insulator layer 70 may be manufactured on the gate electrode 60 by the deposition method.

In S24, an active layer is formed on the gate insulator layer.

Figure 12:
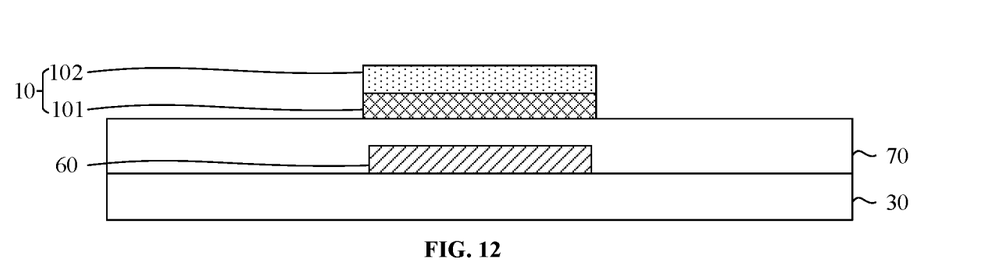
FIG. 12 is a process diagram of a method for manufacturing a thin film transistor according to an embodiment of the present disclosure.

As shown in FIG. 12, an active layer 10 is manufactured on the gate insulator layer 70.

In embodiments of the present disclosure, the active layer 10 includes a channel layer 101 and a first protection layer 102. The channel layer 101 is made of indium gallium tin oxide, and the first protection layer 102 is made of indium gallium zinc oxide including praseodymium.

In an exemplary embodiment, an indium gallium tin oxide film layer may be firstly sputtered on the gate insulator layer 70, and then; an indium gallium zinc oxide film layer including praseodymium is formed on the indium gallium tin oxide film layer. Next, the channel layer 101 and the first protection layer 102 as shown in FIG. 12 are acquired by patterning the indium gallium tin oxide film layer and the indium gallium zinc oxide film layer including praseodymium.

In S25, a source drain layer is formed on the active layer.

Figure 13:
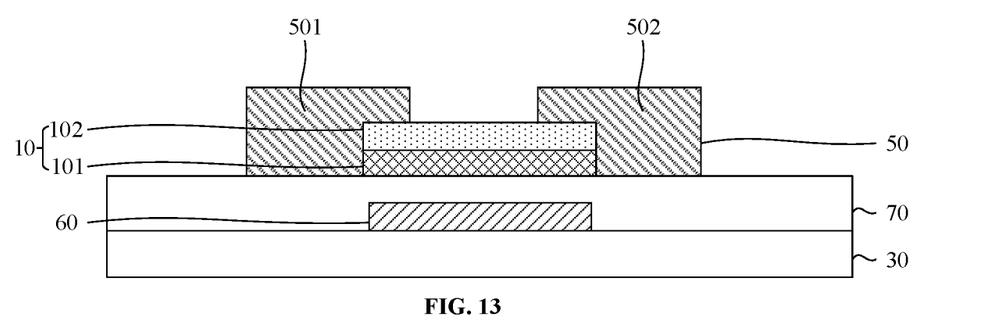
FIG. 13 is a process diagram of a method for manufacturing a thin film transistor according to an embodiment of the present disclosure.

As shown in FIG. 13, the source drain layer 50 is manufactured on the active layer 10; the source drain layer 50 includes a source electrode 501 and a drain electrode 502 disposed on the active layer 10; each of the source electrode 501 and the drain electrode 502 wraps a side wall of the active layer 10, respectively, and is connected to a side wall of the channel layer 101, respectively.

In embodiments of the present disclosure, the source drain layer 50 is a metal layer; a metal film layer may be formed on the active layer 10 by a sputtering method, and then, the source electrode 501 and the drain electrode 502 as shown in FIG. 13 are acquired by patterning the metal film layer.

In S26, a first insulation layer is formed on the source drain layer.

The base substrate as shown in FIG. 1 is acquired by sequentially forming the first insulation layer 80 on the source drain layer 50.

Figure 14:
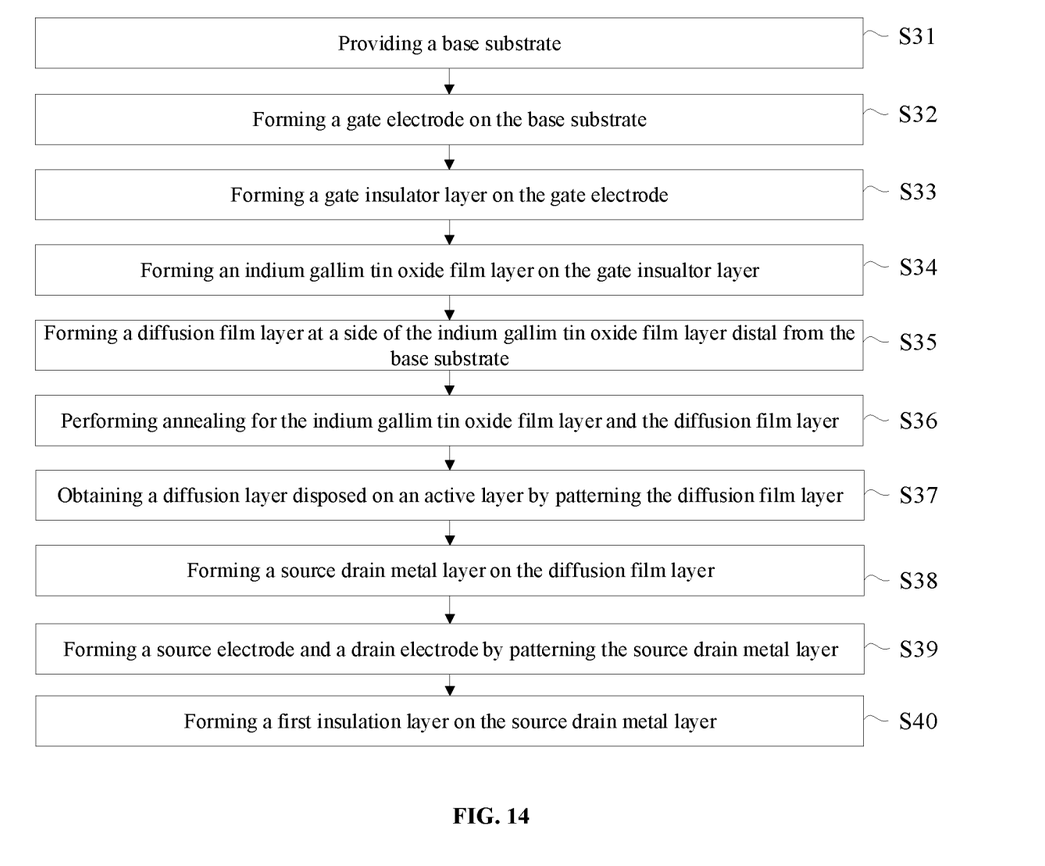
FIG. 14 is a flowchart of a method for manufacturing a thin film transistor according to an embodiment of the present disclosure.

FIG. 14 is a flowchart of a method for manufacturing a thin film transistor according to an embodiment of the present disclosure. As shown in FIG. 14, the method includes the following steps.

In S31, a base substrate is provided.

In S32, a gate electrode is formed on the base substrate.

In S33, a gate insulator layer is formed on the gate electrode.

In S34, an indium gallium tin oxide film layer is formed on the gate insulator layer.

Figure 15:
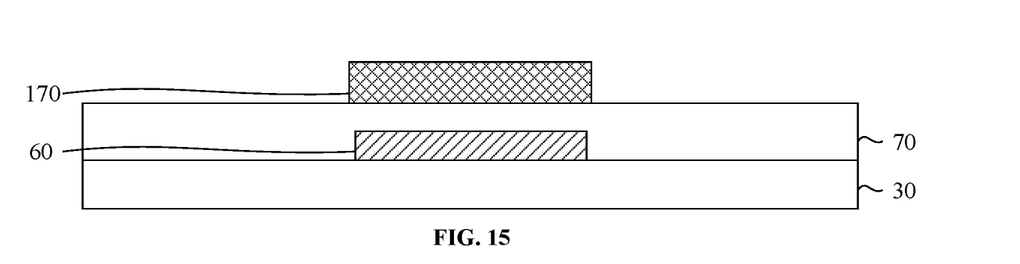
FIG. 15 is a process diagram of a method for manufacturing a thin film transistor according to an embodiment of the present disclosure.

FIG. 15 to FIG. 19 are process diagrams of a method for manufacturing a thin film transistor according to an embodiment of the present disclosure. A process of manufacturing a thin film transistor is described hereinafter in combination with FIG. 15 to FIG. 19. As shown in FIG. 15, the indium gallium tin oxide film layer 170 is formed on the gate insulator layer 70.

In S35, a diffusion film layer is formed at a side of the indium gallium tin oxide film layer distal from the base substrate. The diffusion film layer is a praseodymium metal film layer or a praseodymium oxide film layer.

Figure 16:
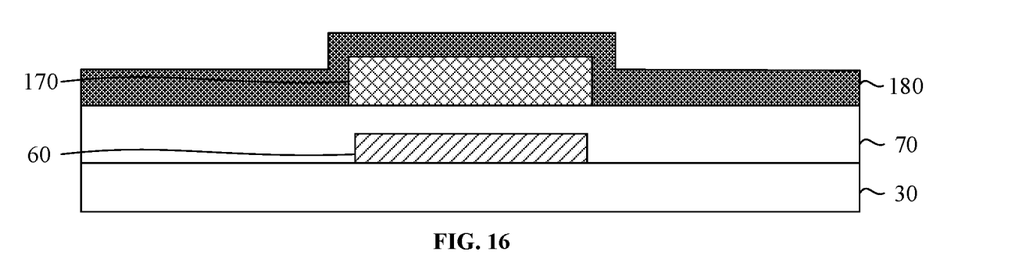
FIG. 16 is a process diagram of a method for manufacturing a thin film transistor according to an embodiment of the present disclosure.

As shown in FIG. 16, a diffusion film layer 180 is formed on the indium gallium tin oxide film layer 170.

In S36, an active layer including a channel layer and a first protection layer that are sequentially laminated on the base substrate is acquired by performing annealing for the indium gallium tin oxide film layer and the diffusion film layer and diffusing praseodymium in the diffusion film layer into the indium gallium tin oxide film layer.

Figure 17:
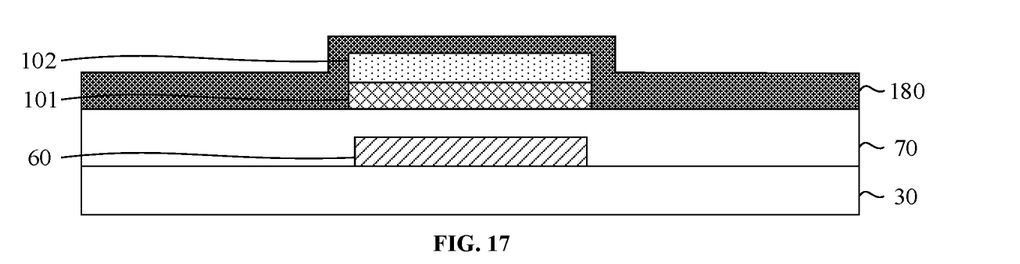
FIG. 17 is a process diagram of a method for manufacturing a thin film transistor according to an embodiment of the present disclosure.

As shown in FIG. 17, the active layer including the channel layer 101 and the first protection layer 102 is formed in the indium gallium tin oxide film layer 170 by performing annealing for the indium gallium tin oxide film layer 170 and the diffusion film layer 180 at the same time and diffusing praseodymium in the diffusion film layer 180 into the indium gallium tin oxide film layer 170.

In S37, a diffusion layer disposed on the active layer is acquired by patterning the diffusion film layer.

Figure 18:
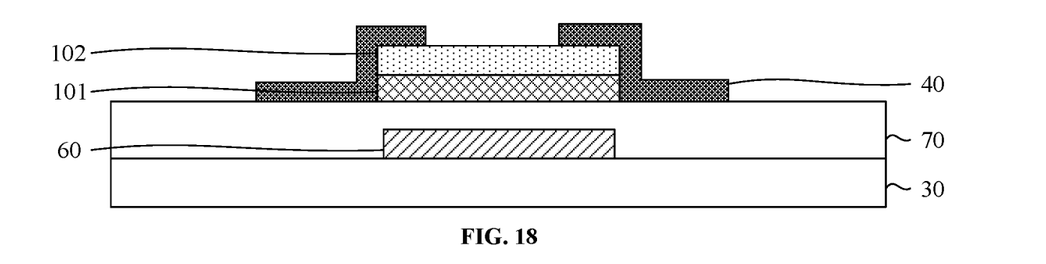
FIG. 18 is a process diagram of a method for manufacturing a thin film transistor according to an embodiment of the present disclosure.

As shown in FIG. 18, the diffusion layer 40 disposed on the active layer is acquired by patterning the diffusion film layer. The diffusion layer 40 is disposed at a side of the first protection layer 102 distal from the base substrate 30 to wrap the side wall of the active layer 10, and the diffusion layer 40 is a praseodymium metal layer or a praseodymium oxide layer.

It is to be noted that in other embodiments, the indium gallium tin oxide film layer 170 and the diffusion film layer 180 may be etched simultaneously to simplify the manufacturing process. That is, a diffusion film layer 180 is directly formed on the indium gallium tin oxide film layer 170, and then, the indium gallium tin oxide film layer 170 and the diffusion film layer 180 are patterned simultaneously to form the active layer 10 and the diffusion layer 40. At this time, the diffusion layer 40 does not wrap the side wall of the active layer 10; the diffusion layer 40 is laminated with the active layer 10 and disposed at a side of the active layer 10 distal from the base substrate 30.

In S38, a source drain metal layer is formed on the diffusion film layer.

In S39, a source electrode and a drain electrode are formed by patterning the source drain metal layer.

Figure 19:
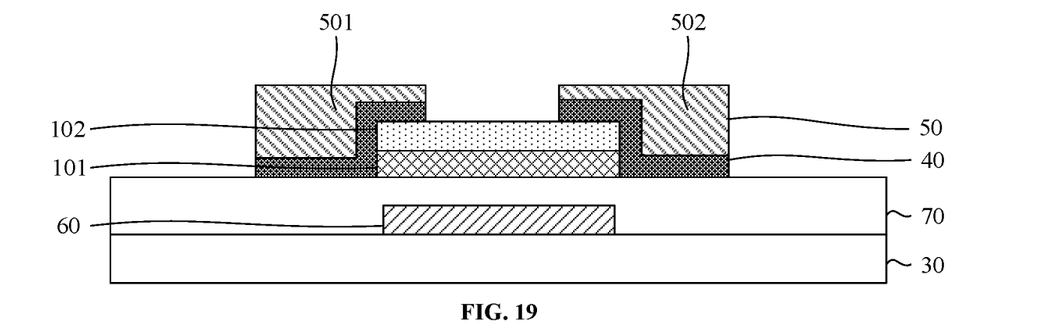
FIG. 19 is a process diagram of a method for manufacturing a thin film transistor according to an embodiment of the present disclosure.

As shown in FIG. 19, the source drain layer 50 as shown in FIG. 19 may be acquired by patterning the source drain metal layer after the source drain metal layer is manufactured on the diffusion film layer 180.

In S40, a first insulation layer is formed on the source drain layer.

The base substrate as shown in FIG. 5 is acquired by forming the first insulation layer 80 on the source drain layer 50.

It is to be noted that in other embodiments. S35 to S37 may also be omitted; the source drain metal layer including praseodymium is directly formed on the indium gallium tin oxide film layer, and then, praseodymium in the source drain metal layer is diffused into the indium gallium tin oxide film layer by patterning the source drain metal layer, such that the active layer including the channel layer and the first protection layer is formed in the indium gallium tin oxide film layer.

An embodiment of the present disclosure further provides an array substrate. The array substrate includes a base substrate 30 and a plurality of laminated thin film transistors; the thin film transistor is the thin film transistor shown in any of FIG. 1 to FIG. 7.

Figure 20:
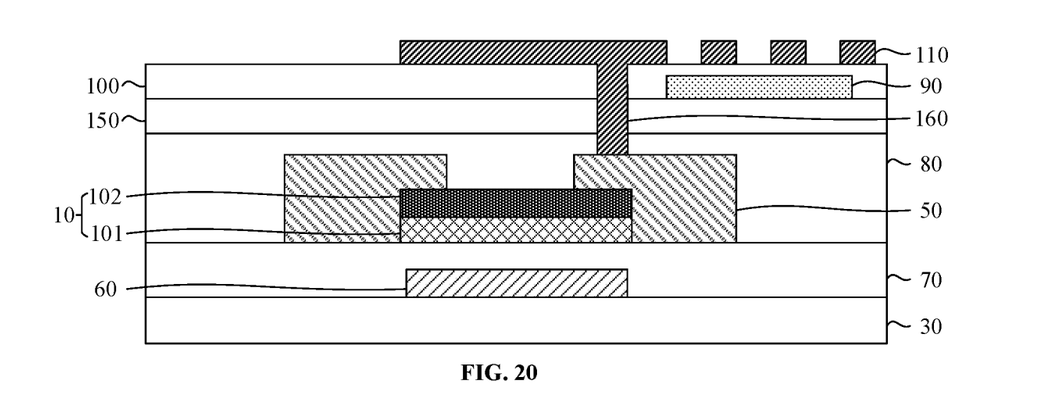
FIG. 20 is a sectional structural schematic diagram of an array substrate according to an embodiment of the present disclosure.

FIG. 20 is a sectional structural schematic diagram of an array substrate according to an embodiment of the present disclosure. As shown in FIG. 20, the array substrate further includes a first electrode layer 90, a second insulation layer 100 and a second electrode layer 110. The first electrode layer 90 includes a plurality of first electrodes disposed at a side of the first insulation layer 80 distal from the base substrate 30. The second insulation layer 100 is covered on the plurality of first electrodes. The second electrode layer 110 is disposed at a side of the second insulation layer 100 distal from the base substrate 30, and electrically connected to a source electrode 501 or a drain electrode 502 of the corresponding thin film transistor.

The array substrate according to an embodiment of the present disclosure may be applicable to a liquid crystal display device. At this time, one of the first electrode layer 90 and the second electrode layer 110 is a pixel electrode layer, and the other is a common electrode layer; the second insulation layer 100 isolates the first electrode layer 90 from the second electrode layer 110.

In embodiments of the present disclosure, the first electrode layer 90 and the second electrode layer 110 are indium tin oxide layers to ensure conductivity and transparency of the first electrode layer 90 and the second electrode layer 110.

A reference is further made to FIG. 20, The array substrate further includes a planarization layer 150 disposed between the first insulation layer 80 and the first electrode layer 90. The planarization layer 150 may enable a flatter surface on which the first insulation layer 80 is disposed, thereby facilitating manufacturing the first electrode layer 90.

In embodiments of the present disclosure, the planarization layer 150 is a resin layer.

A reference is further made to FIG. 20. The first insulation layer 80, the planarization layer 150 and the second insulation layer 100 have a via hole 160, through which the second electrode 110 is electrically connected to the source electrode 501 or the drain electrode 502 in the source drain layer 50.

An embodiment of the present disclosure further provides a display device. The display device includes the array substrate shown in FIG. 20.

In specific implementations, the display device according to the embodiment of the present disclosure may be any product or component with a display function, such as a mobile phone, a tablet computer, a television, a monitor, a laptop, a digital photo frame and a navigator.

Described above are merely preferred embodiments of the present disclosure, and are not intended to limit the present disclosure. Within the spirit and principles of the present disclosure, any modifications, equivalent substitutions, improvements, and the like are within the scope of protection of the present disclosure.

What is claimed is:

1. A thin film transistor, comprising an active layer, wherein the active layer comprises at least two metal oxide semi-conductor layers, the at least two metal oxide semi-conductor layers comprise a channel layer and a first protection layer, and metal elements in the channel layer comprise tin and at least one of indium, gallium and zinc; and, the first protection layer comprises praseodymium used to absorb photo-generated electrons from at least one of the channel layer and the first protection layer which is under light irradiation and reduce a photo-generated current caused by the light irradiation, and a number of praseodymium atoms per unit volume at a position distal from the channel layer is less than a number of praseodymium atoms per unit volume at a position proximal to the channel layer.

2. The thin film transistor according to claim 1, wherein the metal elements in the channel layer comprise tin, indium and gallium;
  a ratio of a number of indium atoms in the channel layer to a total number of indium atoms, gallium atoms and tin atoms in the channel layer is between 65% and 75%;
  a ratio of a number of gallium atoms in the channel layer to a total number of indium atoms, gallium atoms and tin atoms in the channel layer is between 24% and 30%; and
  a ratio of a number of tin atoms in the channel layer to a total number of indium atoms, gallium atoms and tin atoms in the channel layer is between 1% and 5%.

3. The thin film transistor according to claim 1, wherein praseodymium is doped into the channel layer; in the channel layer, a number of praseodymium atoms per unit volume in the channel layer gradually decreases in a direction being distal from the first protection layer.

4. The thin film transistor according to claim 1, wherein the first protection layer is disposed on a surface of the channel layer proximal to a base substrate of the thin film transistor.

5. The thin film transistor according to claim 1, wherein metal elements in the first protection layer further comprise at least one of tin, indium, gallium and zinc; a ratio of a number of praseodymium atoms in the first protection layer to a total number of atoms of metal elements in the first protection layer is between 1% and 50%.

6. The thin film transistor according to claim 5, wherein the metal elements in the first protection layer further comprise indium, gallium and zinc;
  a ratio of a number of indium atoms in the first protection layer to a total number of indium atoms, gallium atoms and zinc atoms in the first protection layer is between 45% and 55%;

a ratio of a number of gallium atoms in the first protection layer to a total number of indium atoms, gallium atoms and zinc atoms in the first protection layer is between 25% and 35%;

a ratio of a number of zinc atoms in the first protection layer to a total number of indium atoms, gallium atoms and zinc atoms in the first protection layer is between 15% and 25%.

7. An array substrate, comprising a base substrate and a plurality of thin film transistors according to claim 1 on the base substrate.

8. The array substrate according to claim 7, further comprising:

a first insulation layer covered on the first protection layer, the source electrode and the drain electrode;

a first electrode layer comprising a plurality of first electrodes disposed at a side of the first insulation layer distal from the base substrate;

a second insulation layer covered on the plurality of first electrodes; and a second electrode layer disposed at a side of the second insulation layer distal from the base substrate and electrically connected to the source electrode or the drain electrode in the corresponding thin film transistor.

9. A display device, comprising the array substrate according to claim 7.

10. The display device according to claim 9, wherein the first protection layer is disposed on a surface of the channel layer distal from a base substrate of the thin film transistor;

the active layer comprises at least three metal oxide semi-conductor layers comprising the channel layer, the first protection layer and a second protection layer; and the second protection layer is disposed on a surface of the channel layer proximal to the base substrate, wherein the second protection layer comprises praseodymium.

11. The thin film transistor according to claim 1, wherein the first protection layer is disposed on a surface of the channel layer distal from a base substrate of the thin film transistor.

12. The thin film transistor according to claim 11, further comprising:

a diffusion layer disposed at a side of the first protection layer distal from the base substrate, wherein the diffusion layer is a praseodymium metal layer or a praseodymium oxide layer.

13. The thin film transistor according to claim 11, further comprising:

a source electrode and a drain electrode disposed on the active layer, wherein each of the source electrode and the drain electrode wraps a side wall of the active layer, respectively, and is connected to a side wall of the channel layer, respectively; each of the source electrode and the drain electrode comprises praseodymium.

14. The thin film transistor according to claim 11, wherein the active layer comprises at least three metal oxide semi-conductor layers comprising the channel layer, the first protection layer and a second protection layer; and the second protection layer is disposed on a surface of the channel layer proximal to the base substrate, wherein the second protection layer comprises praseodymium.

15. The thin film transistor according to claim 14, wherein the second protection layer is an indium gallium zinc oxide layer comprising praseodymium;

a ratio of a number of praseodymium atoms in the second protection layer to a total number of atoms of metal elements in the second protection layer is between 1% and 50%.

16. The thin film transistor according to claim 11, wherein the active layer comprises at least five metal oxide semi-conductor layers comprising the channel layer, the first protection layer, the second protection layer, a source drain layer and a covering layer;

the source drain layer is disposed on a surface of the first protection layer distal from the base substrate; and a covering layer is disposed between the first protection layer and the source drain layer, wherein the covering layer is a crystalline oxide layer without doped praseodymium.

17. The thin film transistor according to claim 16, wherein the covering layer is a crystalline metal oxide layer, and metals in the crystalline metal oxide layer comprise at least one of indium, gallium, zinc and tin.

18. A method for manufacturing a thin film transistor, comprising:

providing a base substrate; and forming an active layer of the thin film transistor by sequentially forming at least two metal oxide semi-conductor layers on the base substrate, wherein the at least two metal oxide semi-conductor layers comprise a channel layer and a first protection layer, and metal elements in the channel layer comprise tin and at least one of indium, gallium and zinc; and the first protection layer comprises praseodymium used to absorb photo-generated electrons at least one of the channel layer and the first protection layer which is under light irradiation and reduce a photo-generated current caused by the light irradiation, and a number of praseodymium atoms per unit volume at a position distal from the channel layer is less than a number of praseodymium atoms per unit volume at a position proximal to the channel layer.

19. The method according to claim 18, wherein sequentially forming at least two metal oxide semi-conductor layers on the base substrate comprises:

forming an indium gallium tin oxide film layer on the base substrate;

forming a diffusion film layer at a side of the indium gallium tin oxide film layer distal from the base substrate, wherein the diffusion film layer is a praseodymium metal film layer or a praseodymium oxide film layer;

obtaining an active layer comprising the channel layer and the first protection layer that are sequentially laminated on the base substrate by performing annealing for the indium gallium tin oxide film layer and the diffusion film layer and diffusing praseodymium in the diffusion film layer into the indium gallium tin oxide film layer; and obtaining a diffusion layer disposed on the active layer by patterning the diffusion film layer, wherein the diffusion layer is disposed at a side of the first protection layer distal from the base substrate, and the diffusion layer is a praseodymium metal layer or a praseodymium oxide layer.

20. The method according to claim 19, further comprising:

forming a source drain metal layer on the diffusion layer, wherein the source drain metal layer comprises praseodymium; and forming a source electrode and a drain electrode by patterning the source drain metal layer.

\* \* \* \* \*